Aug. 4, 1964 J. H. HARMAN ETAL 3,143,707
GATED DUAL IDENTICAL CHANNEL A.G.C.
Filed June 23, 1961
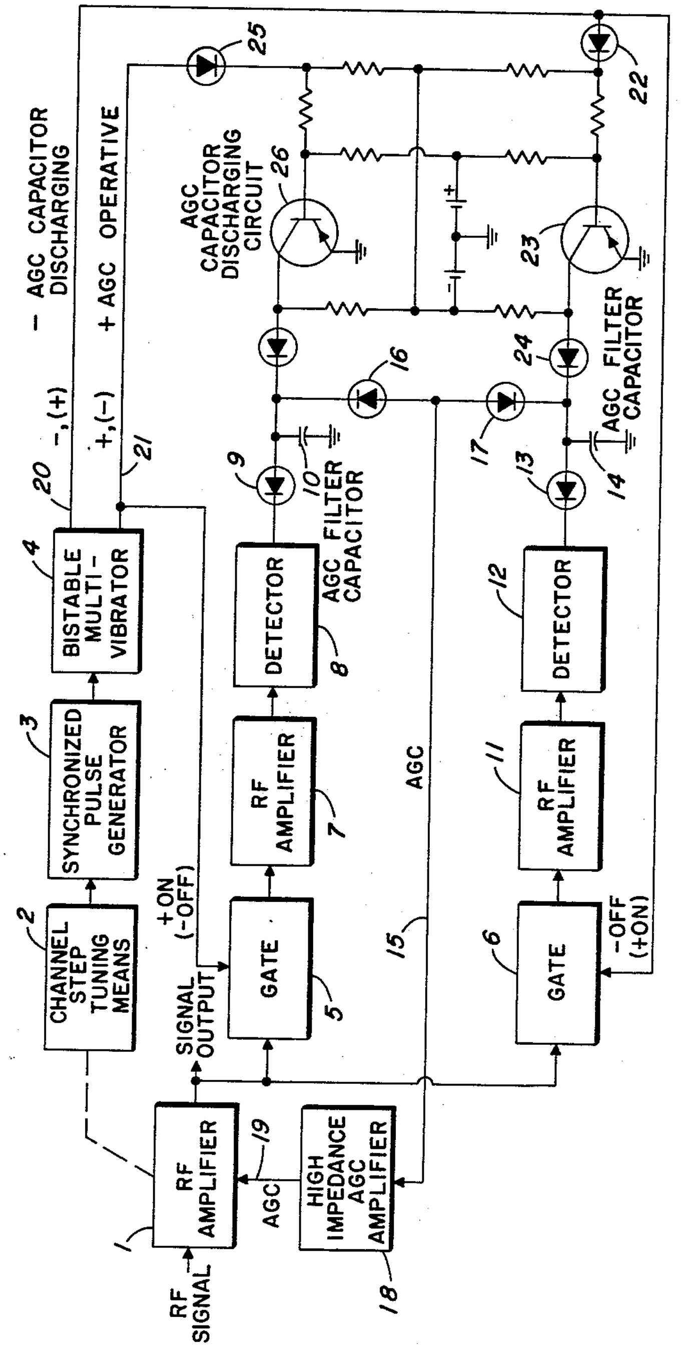
INVENTORS
JEFFERSON H. HARMAN
WAYNE L. NICKEL
BY Moody and Antrim
AGENTS 3,143,707
GATED DUAL IDENTICAL CHANNEL A.G.C.

Jefferson H. Harman and Wayne L. Nickel, both of Richardson, Tex., assignors to Collins Radio Company, Cedar Rapids, Iowa, a corporation of Iowa Filed June 23, 1961, Ser. No. 119,173
3 Claims. (Cl. 325—404)

This invention pertains to automatic-gain-control circuits having rapid change in discharge time of their filter capacitors, and particularly to dual output gain control circuits which have their filter capacitors discharged alternately and which are then interchangeably substituted into gain control circuits of radio-frequency amplifiers.

The automatic-gain control (A.G.C.) circuit of this invention provides rapid change from low or intermediate gain to full gain of a radio-frequency amplifier when the signal level decreases markedly as the tuning of the amplifier is tuned rapidly from a channel having a strong incoming signal to an adjacent channel having a weak incoming signal. When the receiver is being tuned rapidly from a strong signal to an adjacent weak signal, this rapid change in A.G.C. ensures that the gain of the receiver will have been increased sufficiently by the time that the channel for the weak signal is encountered to prevent tuning through the channel of the weak signal before its presence is recognized. The time constant of the present A.G.C. is relatively long as soon as the new signal has been tuned in, and effectively remains so except when a rapid change is required to accommodate a different level of a newly received signal. This A.G.C. is to be differentiated from prior A.G.C. circuits which in addition to changing gain rapidly in accordance with different levels of signals because of the short time constant of the circuits, also follow the slow modulation of received signal until circuits with longer time constants are substituted for those with short time constants.

The present arrangement includes two identical A.G.C. circuits which are interchangeable and operative alternately for controlling the gain of an amplifier. While one A.G.C. circuit is connected to become operative, the filter circuit of the other is quickly discharged in preparation for subsequent control of the associated radio-frequency amplifier. At the instant that the circuits are again interchanged, the discharged filter capacitor readily charges to the value required for obtaining a desired level of the newly received signal at the output of the amplifier.

In the specific circuit described in detail below, a multivibrator which is used as a switching circuit is triggered to the other of its two stable positions in response to the selection of a new signal channel. Operation of the multivibrator disconnects from the output of the associated radio-frequency amplifier the input of the A.G.C. circuit which has been operative, and effectively places a short circuit across its filter capacitor while simultaneously connecting the other A.G.C. circuit having a discharged filter capacitor to the radio-frequency amplifier.

An object of the present invention is to provide an A.G.C. circuit which adjusts the gain of an associated amplifier very rapidly to the required level at the instant that the amplifier is tuned to a different channel.

Another object is to provide an A.G.C. circuit which adjusts rapidly upon acquisition of a new channel and which instantly has the usual long time constant for control independent of modulation of the incoming signal.

The following description and the appended claims may be more readily understood with reference to the single figure of the accompanying drawing in which the automatic-gain-control circuits of this invention are shown in a combination block and schematic diagram.

The A.G.C. circuit shown in the drawing has identical alternate circuits for controlling the gain of a radio-frequency amplifier which is tuned in steps to different signal channels. The tuning means for tuning the radio-frequency amplifier may be either an automatic shaft positioning system for positioning tuning elements, or a switching system for substituting different combinations of tuning elements for different channels. When different channels are to be monitored successively, the tuning circuits may be stepped to different channels in rapid succession. In order to provide control means for alternately connecting the two different automatic-gain-control circuits, a pulse generator 3 is coupled or connected to a channel stepping means 2 for generating a pulse in synchronism with the stepping of the tuning means. In the present circuit a bistable multivibrator circuit 4 is connected to synchronize pulse generator 3, and in response to the application of each pulse, the state of the multivibrator 4 is changed from one of its stable states to the other.

In addition to being connected to signal or monitoring output circuits, the signal output of radio-frequency amplifier 1 is connected to the inputs of gates 5 and 6 of respective alternate A.G.C. circuits. The gates are conductive alternately in accordance with the state of operation of bistable multivibrator 4. When the gate 5 is conductive, the output of amplifier 1 is connected through radio-frequency amplifier 7 to detector 8. The output of detector 8 is connected through diode 9 to the A.G.C. filter capacitor 10. The negative direct-current component at the output of detector 8 which is developed in response to the application of signal is applied through diode 9 for charging the capacitor 10 to the value required for controlling the gain of radio-frequency amplifier 1.

When the gate 5 becomes nonconductive in response to the operation of bistable multivibrator 4, the gate 6 becomes conductive for connecting an identical A.G.C. circuit to the output of radio-frequency amplifier 1. The output of the amplifier is then connected through the gate 6 and radio-frequency amplifier 11 to detector 12. Likewise, a direct-current component of the detector signal is applied through diode 13 to the capacitor 14.

The negative control voltage is applied to A.G.C. conductor 15 from that filter capacitor across which the greater voltage exists. When the greater voltage exists across the capacitor 10, the voltage is applied through the diode 16 to the A.G.C. conductor, while the A.G.C. voltage applies reverse bias to the diode 17 for disconnecting capacitor 14 from the A.G.C. conductor. Likewise, when the capacitor 10 is being short-circuited, the A.G.C. voltage is applied from the capacitor 14 through diode 17 to A.G.C. conductor 15. The A.G.C. conductor is connected either directly to the control circuits of radio-frequency amplifier 1, or is connected as shown through a high impedance A.G.C. amplifier 18 to the A.G.C. conductor 19 of the radio-frequency amplifier 1.

One of the A.G.C. filter capacitors 10 and 14 is discharged instantly, while the other capacitor becomes effective to control the gain of the radio-frequency amplifier 1. The capacitor that is to be discharged may be momentarily short-circuited by a switching circuit or by an electron control circuit responsive to a change of channel or to a sudden decrease in signal level. In the present circuit the multivibrator 4 applies voltage for causing the filter capacitor of an A.G.C. circuit to be short-circuited at the time that it opens the gate of that A.G.C. circuit to disconnect it from radio-frequency amplifier 1.

Assume in response to the operation of the multivibrator 4 that a negative voltage is applied to its output conductor 20 for operating the gate 6 from a conductive to a non-conductive state and for short-circuiting the filter capacitor 14. Simultaneously, the gate 5 is operated to a conductive state in response to the application of positive voltage to the output conductor 21 of the multivibrator 4 to cause capacitor 10 to become charged as required for controlling the gain of amplifier 1. The conductor 20 from the output of multivibrator 4 is connected to the diode 22 which is connected to the base of transistor 23. The diode 22 becomes non-conductive in response to the application of negative voltage to conductor 20 to permit the bias circuit of the type PNP transistor 23 to increase the negative bias on the base of the transistor. The diode 24 and the collector-to-emitter circuit of transistor 23 are in a series shorting circuit connected across the A.G.C. filter capacitor 14. In response to the application of negative bias to the base of transistor 23, the impedance of the collector circuit of transistor 23 is decreased to short-circuit capacitor 14. The short circuit discharges capacitor 14 quickly so that the A.G.C. circuit that includes this capacitor may be returned to its control operation instantly in response to the change of state of the multivibrator 4. Likewise, when negative voltage is applied to other output conductor 21 by the multivibrator 4, the diode 25 which is connected to the base circuit of the transistor 26 becomes non-conductive for reducing the impedance of that transistor to discharge the other filter capacitor 10.

The A.G.C. described herein provides fast change of A.G.C. voltage as required by a newly selected signal of substantially decreased level. The proper control voltage is supplied as quickly as the filter capacitor of the newly connected A.G.C. circuit can receive a charge from the acquired signal. When the receiver is to dwell on a particular selected channel for monitoring the signal, the multivibrator remains in whichever one of its stable states it happens to be so that the A.G.C. circuit which was connected to the output of the radio-frequency amplifier at the time of the acquisition of the signal can continue to provide the A.G.C. control.

Although this invention has been described for one particular embodiment, the dual A.G.C. circuit which provides effective control quickly for newly acquired weak signal and which is independent of modulation may be changed for different applications in ways obvious to those skilled in the art and still be within the spirit and scope of the following claims.

We claim:

1. An automatic-gain-control circuit having first and second filter capacitors to be charged to required control voltages for controlling the gain of a radio-frequency amplifier, an automatic-gain-control conductor connected to said amplifier to which control voltage is to be applied to control the gain of the amplifier, detector means having an input connected to the output of said amplifier and having a separate charging circuit connected to each of said filter capacitors, said detector means being responsive to the application of signal from the output of said amplifier to develope control voltages to charge said capacitors, first and second switching means, said first switching means being operable to short-circuit said first and second capacitors alternately, and said second switching means being operable to connect said automatic-gain-control conductor to that one of said filter capacitors which is not being short-circuited by said first switching means and which has been charged to the higher voltage by said detector means.

2. An automatic-gain-control arrangement for controlling the gain of a radio-frequency amplifier that receives successively signals of much different levels comprising, dual automatic-gain-control circuits, each having a filter capacitor and means for charging said respective capacitor instantly upon application of signal to the input of said respective automatic-gain-control circuit, said radio-frequency amplifier having an automatic-gain-control conductor, means for connecting said automatic-gain-control conductor to that one of said capacitors having the greater charge, means operating in synchronism with the application of said different signals for alternately connecting the inputs of said automatic-gain-control circuits to the output of said radio-frequency amplifier and for alternately short-circuiting each of said filter capacitors at the instant that its respective automatic-gain-control circuit is disconnected from the output of said amplifier, and said means removing said short circuit from each of said capacitors when its respective automatic-gain-control circuit is reconnected to the output of said radio-frequency amplifier so that said capacitor of said reconnected automatic-gain-control circuit may instantly charge to the required voltage for controlling the gain of said radio-frequency amplifier.

3. In a radio receiver having a radio-frequency amplifier and tuning means for tuning the amplifier rapidly to different signal channels, dual automatic-gain-control circuits effective alternately for controlling the gain of said amplifier, each of said automatic-gain-control circuits having a gate for connecting the input of the respective circuit to the output of said amplifier, a detector responsive to application of signal from said amplifier for developing an automatic-gain-control voltage and and filter capacitor connected to the output of said respective detector for storing automatic-gain-control voltage independent of modulation of incoming signal, a diode for each of said automatic-gain-control circuits, said amplifier having an automatic-gain-control conductor connected through a respective one of said diodes to each of said filter capacitors, said diodes having the proper polarity for connecting said automatic-gain-control conductor to only that capacitor having the greater charge, a synchronized pulse generator connected to said tuning means for forming an output pulse in response to tuning said amplifier to a different channel, switching means operating in response to the application of each one of said pulses from said pulse generator for opening one of said gates while closing the other gate to connect alternately the inputs of said automatic-gain-control circuits to the output of said amplifier, means responsive to the operation of said switching means for short-circuiting instantly each of said filter capacitors as its automatic-gain-control circuit is disconnected from the output of said radio-frequency amplifier, and said filter capacitor of the automatic-gain-control circuit that is being connected to the output of said radio-frequency amplifier being charged rapidly in response to reception of incoming signal to the required voltage for controlling the gain of said amplifier.

References Cited in the file of this patent

UNITED STATES PATENTS 2,498,659 DeRosa -------------- Feb. 28, 1950